United States Patent
Hill et al.

(10) Patent No.: US 7,180,603 B2
(45) Date of Patent: Feb. 20, 2007

(54) REDUCTION OF THERMAL NON-CYCLIC ERROR EFFECTS IN INTERFEROMETERS

(75) Inventors: Henry A. Hill, Tucson, AZ (US); Michael Schroeder, East Hampton, CT (US); Andrew Eric Carlson, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 79 days.

(21) Appl. No.: 10/879,681

(22) Filed: Jun. 28, 2004

(65) Prior Publication Data

US 2005/0094155 A1     May 5, 2005

Related U.S. Application Data

(60) Provisional application No. 60/482,855, filed on Jun. 26, 2003.

(51) Int. Cl.
*G01B 9/02* (2006.01)
(52) U.S. Cl. .......................... 356/500; 356/498
(58) Field of Classification Search ........ 356/484–487, 356/491–493, 496, 498, 500, 508, 509
See application file for complete search history.

(56) References Cited

U.S. PATENT DOCUMENTS

| | | | |
|---|---|---|---|
| 4,784,490 A | * | 11/1988 | Wayne ...................... 356/487 |
| 4,790,651 A | | 12/1988 | Brown et al. |
| 4,802,765 A | | 2/1989 | Young et al. |
| 5,064,289 A | | 11/1991 | Bockman |
| 5,114,234 A | | 5/1992 | Otsuka et al. |
| 5,151,749 A | | 9/1992 | Tanimoto et al. |
| 5,187,543 A | | 2/1993 | Ebert |
| 5,331,400 A | | 7/1994 | Wilkening et al. |

(Continued)

FOREIGN PATENT DOCUMENTS

JP    7-351078    12/1995

(Continued)

OTHER PUBLICATIONS

Badami, V.G. et al. "Investigation of Nonlinearity in High Accuracy Heterodyne Laser Interferometry." *American Society for Precision Engineering 1997 Proceedings*, 16:pp. 153-156, 1997.

(Continued)

*Primary Examiner*—Gregory J. Toetley, Jr.
*Assistant Examiner*—Patrick Connolly
(74) *Attorney, Agent, or Firm*—Fish & Richardson P.C.

(57) ABSTRACT

In general, in one aspect, the invention features an interferometer assembly for use in a lithography tool used for fabricating integrated circuits on a wafer, wherein the lithography tool includes a support structure and a stage for positioning the wafer relative to the support structure, the interferometer assembly including an interferometer configured to direct a measurement beam between the stage and the support structure and combine the measurement beam with another beam to form an output beam which includes a phase related to a position of the stage relative to the support structure, wherein the interferometer is mechanically secured to the lithography tool through an interferometer surface selected to cause the phase of the output beam to be insensitive to thermal changes of the interferometer over a range of temperatures.

38 Claims, 12 Drawing Sheets

U.S. PATENT DOCUMENTS

| | | | |
|---|---|---|---|
| 5,408,318 | A | 4/1995 | Slater |
| 5,491,550 | A | 2/1996 | Dabbs |
| 5,663,793 | A | 9/1997 | de Groot |
| 5,724,136 | A | 3/1998 | Zanoni |
| 5,757,160 | A | 5/1998 | Kreuzer |
| 5,764,361 | A | 6/1998 | Kato et al. |
| 5,781,277 | A | 7/1998 | Iwamoto |
| 5,790,253 | A | 8/1998 | Kamiya |
| 5,801,832 | A | 9/1998 | Van Den Brink |
| 6,008,902 | A | 12/1999 | Rinn |
| 6,020,964 | A | 2/2000 | Loopstra et al. |
| 6,046,792 | A | 4/2000 | Van Der Werf et al. |
| 6,134,007 | A | 10/2000 | Naraki et al. |
| 6,137,574 | A | 10/2000 | Hill |
| 6,181,420 | B1 | 1/2001 | Badami et al. |
| 6,201,609 | B1 | 3/2001 | Hill et al. |
| 6,208,424 | B1 | 3/2001 | de Groot |
| 6,236,507 | B1 | 5/2001 | Hill et al. |
| 6,246,481 | B1 | 6/2001 | Hill |
| 6,252,668 | B1 | 6/2001 | Hill |
| 6,252,688 | B1 | 6/2001 | Ishikawa et al. |
| 6,271,923 | B1 | 8/2001 | Hill |
| 6,304,318 | B1 | 10/2001 | Matsumoto |
| 6,313,918 | B1 | 11/2001 | Hill et al. |
| 6,327,039 | B1 * | 12/2001 | de Groot et al. ............ 356/517 |
| 6,330,065 | B1 | 12/2001 | Hill |
| 6,330,105 | B1 | 12/2001 | Rozelle et al. |
| 6,384,899 | B1 * | 5/2002 | den Boef ..................... 355/69 |
| 6,417,927 | B2 | 7/2002 | de Groot |
| 6,541,759 | B1 | 4/2003 | Hill |
| 6,757,066 | B2 | 6/2004 | Hill |
| 6,956,655 | B2 | 10/2005 | Hill |
| 2002/0089671 | A1 | 7/2002 | Hill |
| 2003/0053079 | A1 | 3/2003 | Hill |
| 2003/0090675 | A1 | 5/2003 | Fujiwara |

FOREIGN PATENT DOCUMENTS

| | | |
|---|---|---|
| JP | 8-117083 | 4/1996 |
| JP | 10 260009 | 9/1998 |

OTHER PUBLICATIONS

Bennett, S.J. "A Double-Passed Michelson Interferometer." *Optics Communications*, 4:6, pp. 428-430, 1972.

Bobroff, Norman. "Recent advances in displacement measuring interferometry." *Meas. Sci. Technol*, 4: pp. 907-926, 1993.

Hines, Brad et al. "Sub-Nanometer Laser Metrology—Some Techniques and Models." *European Southern Observatory, ESO Conference*, pp. 1195-1204, 1991.

Oka, K. et al. "Polarization heterodyne interferometry using another local oscillator beam." *Optics Communications*, 92:pp. 1-5, 1992.

Wu, Chien-Ming. Analytical modeling of the periodic nonlinearity in heterodyne interferometry. *Applied Optics*, 37:28 pp. 6696-6700, 1998.

J.-P. Monchalin et al. "Accurate Laser Wavelength Measurement With A Precision Two-Beam Scanning Michelson Interferometer", *Applied Optics*, 20(5), 736-757, (1981).

C. Zanoni, "Differential interferometer arrangements for distance and angle measurements: Principles, advantages and applications", *VDI Berichte* Nr. 749, 93-106, (1989).

* cited by examiner

REDUCTION OF THERMAL NON-CYCLIC ERROR EFFECTS IN INTERFEROMETERS

CROSS-REFERENCE TO RELATED APPLICATIONS

This application claims priority under 35 U.S.C. §119 to Provisional Patent Application No. 60/482,855, entitled "REDUCTION OF THERMAL NON-CYCLIC ERROR EFFECTS IN INTERFEROMETERS," filed on Jun. 26, 2003, the entire contents of which are hereby incorporated by reference.

BACKGROUND

This invention relates to interferometers, e.g., linear and angular displacement measuring and dispersion interferometers, that measure linear and angular displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarization beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object.

Unfortunately, this equality is not always exact. Many interferometers include non-linear effects such as those known as "cyclic errors." The cyclic errors can be expressed as contributions to the phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. Nos. 6,137,574, 6,252,688, and 6,246,481 by Henry A. Hill.

There are in addition to the cyclic errors, non-cyclic non-linear errors or non-cyclic errors. One example of a source of a non-cyclic error is the diffraction of optical beams in the measurement paths of an interferometer. Non-cyclic error due to diffraction has been determined for example by analysis of the behavior of a system such as found in the work of J. -P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736–757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

High precision displacement measurement requirements of integrated circuit micro-lithography fabrication have become very demanding, in part because of the small field limitations of imaging systems in steppers and scanners and in part because of the continuing reduction in the size of trace widths on wafers. The requirement of high precision displacement measurement with steppers and scanners is typically served with plane mirror interferometers with one of the external mirrors of the plane mirror interferometers attached to a stage mirror of the stepper or scanner. Because the wafer is typically not flat, the orientation of the wafer stage of a stepper or scanner must also be adjusted in one or more angular degrees of freedom to compensate for the non-flatness of the wafer at exposure sites on a wafer. The combination of the use of plane mirror interferometers and the change in one or more angular degrees of freedom is a source of lateral shear of optical beams across interferometer elements.

In dispersion measuring applications, optical path length measurements are made at multiple wavelengths, e.g. 532 nm and 1064 nm, and are used to measure dispersion of a gas in the measurement path of a distance measuring interferometer. The dispersion measurement can be used to convert a change in optical path length measured by the distance measuring interferometer into a corresponding change in physical length. Such a conversion can be important since changes in the measured optical path length can be caused by gas turbulence and/or by a change in the average density of the gas in the measurement arm even though the physical distance to the measurement object is unchanged.

When working to position-measurement accuracy of approximately 1 nm or better and for distance measuring interferometry using dispersion interferometry to correct for the effects of gas in the measuring path, the cited non-cyclic errors are amplified by the reciprocal dispersive power of the gas, $\Gamma$. For the Nb:YAG laser beam with a wavelength of 1064 nm and the frequency doubled Nb:YAG laser with a beam wavelength of 532 nm, $\Gamma \cong 75$. For the 633 nm HeNe laser beam and a second beam at 316 nm, $\Gamma \cong 25$. Thus, for high-accuracy interferometry (accuracy in the 1 nm regime or better) it is necessary to reduce the effect of the lateral beam shear induced non-cyclic errors in the dispersion interferometry by approximately two orders of magnitude beyond that required for the corresponding distance measuring interferometry, an accuracy in the 10 pm regime or better.

The cited source of lateral beam shear presents a potentially serious problem in distance measuring interferometry. For a measurement leg length of 0.5 m, a typical value for a change in angular orientation of a stage mirror of 0.001 radians, and a double-pass plane mirror interferometer, the relative lateral shear between the reference and the measurement components of the output beam of the interferometer is 2 mm. For a relative lateral shear of 2 mm, a beam diameter of 6 mm, and wavefront errors in the output beam components of the order of $\lambda/20$, an error will be generated in the inferred distance measurement of $>$/~1 nm. This error is a non-cyclic error and can pose a serious limitation to micro-lithographic applications of steppers and scanners in integrated circuit fabrication.

Wavefront errors are produced by non-uniformity of optical properties of optical elements, imperfections in transmissive surfaces and imperfections in components such as retroreflectors, phase retardation plates, and/or coupling into multi-mode optical fibers that produce undesired deformations of wavefronts of beams.

A measured change in relative phase of components of an output beam of an interferometer is generally represented as one or more terms of the form $kL \cos^2 \chi$ where $k$ is a wavenumber corresponding to the wavelength of an input beam to the interferometer, $L$ is a physical length such as a distance from the interferometer to the measurement object, and $\chi$ is an angle that a component of a measurement beam makes with a measurement axis of the interferometer. For the case where the orientation of a stage is substantially not changed about an axis orthogonal to the measurement axis of an interferometer, the precision to which changes in an associated $\chi$ need be known is significantly relaxed and only the precision of the change in relative phase is of concern. However, when there are large systematic changes in $\chi$, e.g., 700 microradians due to changes in pitch and yaw of a stage, effects of errors in $\chi$ can be important.

Consider for example an application where a stage position needs be known to a precision of 0.1 nm such as may be required in an EUV lithography tool. For a high HSPMI having a value of $L=0.6$ m and $\chi=700$ microradians, the precision to which $\chi$ need be known is $\leq 50$ nanoradians.

Non-cyclic errors classified herein as belonging to the geometric type may also be generated by a non-zero difference in the relative direction of propagation of the reference and measurement beam components of an output beam of an interferometer in the presence of a relative beam shear of the reference and measurement beam components of the output beam. Consideration of the amplitude of the heterodyne signal places one restriction on the magnitude of the non-zero difference in the relative direction of propagation. That restriction is typically of the order of 10 microradians. However, consideration of the effects of the geometric type associated with the non-zero difference in the relative direction of propagation places a much tighter restriction, e.g., of the order of 50 nanoradians for $L=0.6$ m and $\chi=700$ microradians in a plane mirror interferometer, on the allowed magnitude of the non-zero difference in relative direction of propagation or the precision to which the non-zero difference in relative direction of propagation need be known.

The non-cyclic errors may be measured and compensated such as described in commonly owned U.S. patent application Ser. No. 10/366,587 filed Feb. 12, 2003 and entitled "CHARACTERIZATION AND COMPENSATION OF NON-CYCLIC ERRORS IN INTERFEROMETRY SYSTEMS" by Henry A. Hill the contents of which are herein incorporated in their entirety by reference. The measurement of the non-cyclic errors in an interferometric metrology system may be performed either before installation of the metrology system in a lithography tool or in situ after installation of the metrology system in the lithography tool. When the measurement of non-cyclic errors is performed in situ in a lithography tool, the presence of non-cyclic errors of the geometric type can increase the time required in a lithography tool to measure the non-cyclic errors and thus decreases the through put of the lithography tool.

In certain end use applications, the specification of properties of interferometers may be in terms of non-cyclic errors excluding the effects of geometric non-cyclic errors. Thus it is desirable in testing an interferometer system prior to installation in a lithography tool to either eliminate the geometric non-cyclic errors or compensate for the effects of geometric non-cyclic errors. The latter of the two options will in general be a more cost effective path since elimination of geometric non-cyclic errors in the interferometer can be prohibitive in cost given the performance required in lithography tools now in use and in tools that are currently being developed.

SUMMARY

Thermal changes (e.g., thermal expansion and/or thermally induced changes in refractive indices) in optical systems can cause variations in the optical path length of a beam propagating in the system. For example, in an interferometry system, thermal changes may cause the optical path length of a measurement and/or reference beam path to change. Of course, where the optical path lengths of the measurement and reference beams change by the same amount, the optical path length difference between the two beam paths is substantially unaffected by the thermal changes. In such instances, a measured phase associated with the optical path length difference should remain insensitive to the thermal changes in the system. However, where thermal changes cause the measurement and reference beam paths to change by different amounts the changes affect the measured phase and can introduce errors into measurements made using the interferometry system. In fact, even in applications operating at nominally constant temperatures (e.g., within tens of milliKelvin of a constant temperature), thermal changes in an interferometry system associated with such thermal changes can introduce errors in the measurements. These errors can be detrimental to measurements made using the interferometry system, particularly where error budgets for the measurements are small.

For example, where interferometry systems are used in lithography tools to monitor the position and/or orientation of a stage relative to exposure optics of the tool, error tolerances can be about 1 nm or less (e.g., about 0.5 nm or less, about 0.2 nm or less, about 0.1 nm). Optical path length differences probed by the interferometry systems can vary by such amounts over temperature fluctuations of about 0.1 K or less, introducing unacceptable noise levels into the interferometer measurements.

In certain aspects, the invention features interferometry systems in which errors due to thermal changes are reduced (e.g., eliminated). Reducing the sensitivity of an interferometer measurement to thermal changes can include appropriate design of the interferometer components and/or appropriate mounting of the interferometer to an object within the structure in which the interferometer is to be used (e.g., to a frame of a lithography tool). In an appropriately mounted interferometer, the optical path length difference between the measurement and reference beam is insensitive to thermal changes of the interferometer. To achieve this, a specific location of the interferometer is secured to the object so that any variations in the measurement beam path due to thermal changes of the interferometer are offset by variations in the reference beam path.

In some embodiments, the location secured to the object corresponds to a surface of the interferometer through which the measurement beam exits. When secured in this way thermal expansion of the interferometer does not change the location of the exit surface with respect to the measurement object.

Alternatively, or additionally, to appropriate mounting of the interferometer to the support structure, thermal errors can be reduced (e.g., eliminated) by constructing the interferometer optics so that contributions to the optical path length of the measurement beam due it propagating through a particular material (e.g., glass, bonding adhesive, waveplate) are matched in the reference beams. Accordingly, changes of the optical path length of one beam in the interferometer optics due to thermal expansion and/or thermally induced changes in refractive indices are matched by changes of in the optical path length of the other beam, maintaining equal contributions to the measured phase in the interferometer's output beam.

In general, in one aspect, the invention features an interferometer assembly for use in a lithography tool used for fabricating integrated circuits on a wafer, wherein the lithography tool includes a support structure and a stage for positioning the wafer relative to the support structure, the interferometer assembly including an interferometer configured to direct a measurement beam between the stage and the support structure and combine the measurement beam with another beam to form an output beam which includes a phase related to a position of the stage relative to the support structure, wherein the interferometer is mechanically secured to the lithography tool through an interferometer surface selected to cause the phase of the output beam to be insensitive to thermal changes of the interferometer over a range of temperatures.

Embodiments of the interferometry assembly can include one or more of the following features, and/or features of other aspects.

The thermal changes can include thermal expansion of the interferometer and/or thermally induced changes in a refractive index of the interferometer. The interferometer surface mechanically secured to the lithography tool can be an exit surface of the measurement beam. The interferometer surface can be selected to cause a distance between the stage and the support structure along the measurement beam to be insensitive to thermal expansion of the interferometer over a range of temperatures. The interferometer can be mechanically secured to the support structure or to the stage. The measurement beam can contact a measurement object (e.g., a plane mirror) one or more times. In some embodiments, the other beam also contacts the measurement object. The interferometer can be a high-stability plane mirror interferometer.

In general, in another aspect, the invention features an interferometer assembly for use in a lithography tool used for fabricating integrated circuits on a wafer, wherein the lithography tool includes a support structure and a stage for positioning the wafer relative to the support structure, the interferometer assembly including an interferometer configured to direct a measurement beam between the stage and the support structure and combine the measurement beam with another beam to form an output beam which includes a phase related to a position of the stage relative to the support structure, wherein the interferometer is secured to the lithography tool through an interferometer surface selected to cause a distance between the stage and the support structure along the measurement beam to be insensitive to thermal expansion of the interferometer over a range of temperatures. The interferometer assembly can include one or more features of other aspects.

In general, in another aspect, the invention features an interferometer assembly for use in a lithography tool used for fabricating integrated circuits on a wafer, wherein the lithography tool includes a support structure and a stage for positioning the wafer relative to the support structure, the interferometer assembly including an interferometer configured to direct a measurement beam between the stage and the support structure through an exit surface of the interferometer and combine the measurement beam with another beam to form an output beam which includes a phase related to a position of the stage relative to the support structure, wherein the interferometer is secured to the lithography tool through a portion of the exit surface.

Embodiments of the interferometer assembly can include one or more of the following features and/or features of other aspects.

Securing the interferometer to the lithography tool through a portion of the exit surface can cause a distance between the support structure and the wafer stage along the measurement beam to be insensitive to thermal expansion of the interferometer over a range of temperatures. The interferometer can be secured to the support structure and directs the measurement beam to reflect from a measurement object secured to the wafer stage. The interferometer can be secured to the wafer stage and directs the measurement beam to reflect from a measurement object secured to the support structure.

In general, in another aspect, the invention features an apparatus, including an interferometer, which during operation produces an output beam including a phase related to an optical path difference between a path of a first beam, which contacts a measurement object, and a path of a second beam, and a mechanical fixture for mechanically securing the interferometer to an object, wherein the interferometer is secured to the mechanical fixture at a location of the interferometer that causes the phase of the output beam to be insensitive to thermal changes of the interferometer over a range of temperatures.

Embodiments of the interferometer assembly can include one or more of the following features and/or features of other aspects.

The thermal changes can include thermal expansion of the interferometer and/or thermally induced changes in a refractive index of the interferometer. The location of the interferometer secured to the mechanical fixture can be a portion of an exit surface of the first beam path. The first beam path can exit the interferometer at an exit surface and the interferometer can be secured to the mechanical, fixture to cause a path length between the exit surface and the measurement object to be insensitive to thermal expansion of the interferometer over a range of temperatures. The location of the interferometer secured to the mechanical fixture can correspond to a portion of the exit surface. The interferometer can be configured so that a thermal variation an optical path length of the first beam path within the interferometer is substantially equal to a thermal variation of an optical path length of the second beam path within the interferometer. The interferometer can be configured so that a thermal variation of an optical path length of the first beam path within the interferometer is unequal to a thermal variation of an optical path length of the second beam path within the interferometer. The first beam path can exit the interferometer at an exit surface and the location of the interferometer secured to the mechanical fixture can be displaced from the exit surface by an amount that causes a thermal variation in the optical path difference of the first and second beam paths within the interferometer to be offset by a thermal variation in the optical path length of the first beam path out of the interferometer. The location of the interferometer secured to the mechanical fixture can be displaced by an amount $\Delta X$ from the exit surface, where $\Delta X$ corresponds to $$\Delta X = \frac{1}{4\alpha k} \frac{d\Phi}{dT},$$

where k is the wavenumber of the first beam, T is the temperature, $\Phi$ is the phase, and $\alpha$ is a thermal expansion coefficient of a medium between the exit surface and the location. The first beam can contact the measurement object more than once. The interferometer can be a high-stability plane mirror interferometer. In some embodiments, the second beam contacts the measurement object.

In general, in another aspect, the invention features an apparatus, including an interferometer configured to produce an output beam including a phase related to an optical path difference between a path of a first beam which exits a measurement beam surface of the interferometer and contacts a measurement object, and a path of a second beam, and a mechanical fixture for mechanically securing the interferometer to an object, wherein a portion of the measurement beam surface is secured to the mechanical fixture.

Embodiments of the apparatus can include one or more of the following features and/or features of other aspects.

The interferometer can be secured to the mechanical fixture so that the phase of the output beam is insensitive to thermal changes of the interferometer over a range of temperatures. The thermal changes can include thermal expansion of the interferometer and/or thermally induced changes in a refractive index of the interferometer.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and a foregoing apparatus for monitoring the position of the wafer relative to the imaged radiation.

In another aspect, the invention features a lithography system for use in fabricating integrated circuits on a wafer, the system including a stage for supporting the wafer, and an illumination system including a radiation source, a mask, a positioning system, a lens assembly, and a foregoing apparatus, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In another aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another, and a foregoing apparatus for monitoring the position of the stage relative to the beam directing assembly.

In another aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using a foregoing apparatus.

In another aspect, the invention features a lithography method for use in the fabrication of integrated circuits including directing input radiation through a mask to produce spatially patterned radiation, positioning the mask relative to the input radiation, monitoring the position of the mask relative to the input radiation using a foregoing apparatus, and imaging the spatially patterned radiation onto a wafer.

In another aspect, the invention features a lithography method for fabricating. integrated circuits on a wafer including positioning a first component of a lithography system relative to a second component of a lithography system to expose the wafer to spatially patterned radiation, and monitoring the position of the first component relative to the second component using a foregoing apparatus.

In another aspect, the invention features a method for fabricating integrated circuits, the method including a foregoing lithography method.

In another aspect, the invention features a method for fabricating integrated circuits, the method including using a foregoing lithography system.

In another aspect, the invention features a method for fabricating a lithography mask, the method including directing a write beam to a substrate to pattern the substrate, positioning the substrate relative to the write beam, and monitoring the position of the substrate relative to the write beam using a foregoing apparatus.

Embodiments of the invention may include any of the following advantages.

Thermal non-cyclic error effects can be reduced, which relax manufacturing tolerances related to thermal non-cyclic errors in interferometers of a metrology system used in, e.g., a lithography tool.

Thermal non-cyclic error effects in an interferometer system can be reduced by the selection of a preferred reference system.

Thermal non-cyclic error effects that arise from the use of materials of differing thermal properties, e.g., thermal expansion and changes in index of refraction, in interferometers can be reduced.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other features, objects, and advantages of the invention will be apparent from the following detailed description.

DESCRIPTION OF DRAWINGS

Like reference symbols in the various drawings indicate like elements.

DETAILED DESCRIPTION

Figure 1:
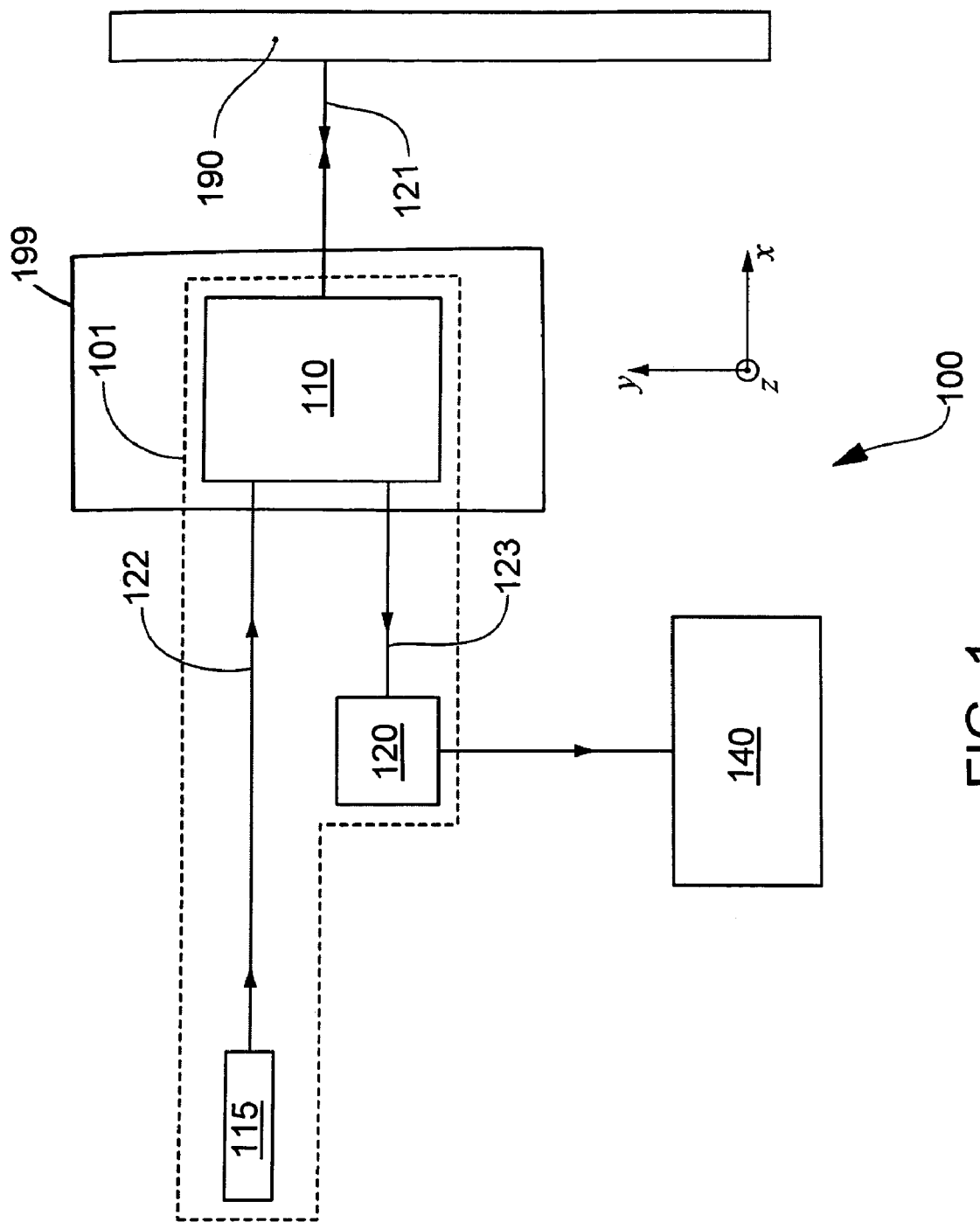
FIG. 1 is a schematic diagram of an embodiment of an interferometry system.

Referring to FIG. 1, an interferometry system 100 includes an interferometer subsystem 101, which is configured to monitor a displacement of a plane mirror measurement object 190 along an axis (i.e., the x-axis for the Cartesian coordinate system shown in FIG. 1). Subsystem 101 includes an interferometer 110 positioned to receive an input beam 122 from a source 115. Interferometer 110 is mechanically secured to an object 199 (e.g., a frame of a lithography tool or a wafer stage within a lithography tool). During operation, interferometer 110 splits input beam 122 into a measurement beam 121 and a reference beam (not shown), directs measurement beam 121 and the reference beam along different paths, and recombines them to form an output beam 123. Interferometer 110 directs measurement beam 121 to reflect from measurement object 190. Output beam 123 includes an interference phase related to the location of measurement object 190 along the x-axis. Although measurement beam 121 is depicted as making a single pass between measurement object 190 and interferometer 110, in many embodiments it makes multiple passes to the measurement object.

Output beam 123 impinges on a detector 120, which detects intensity variations in a polarization component of output beam 123. Detector 120 communicates the time-varying intensity variations to an electronic controller 140 as an interference signal from which electronic controller 140 extracts the interference phase. The interference phase is related to the optical path difference between measurement beam 121 and the reference beam. Subsequently, electronic processor 140 determines a displacement of measurement object 190 relative to interferometer 110 based on a known relationship between the phase, the optical path difference and the relative displacement.

Interferometer 110 is secured to object 199 at a specific location so that the interference phase is insensitive to thermal expansion of the interferometer over a range of temperatures (e.g., over a range of about 10 K or less, about 1 K or less, such as a range of 10–100 mK). The location at which interferometer 110 is secured varies depending on the design of the interferometer. Locations for specific designs are discussed below.

Figure 2:
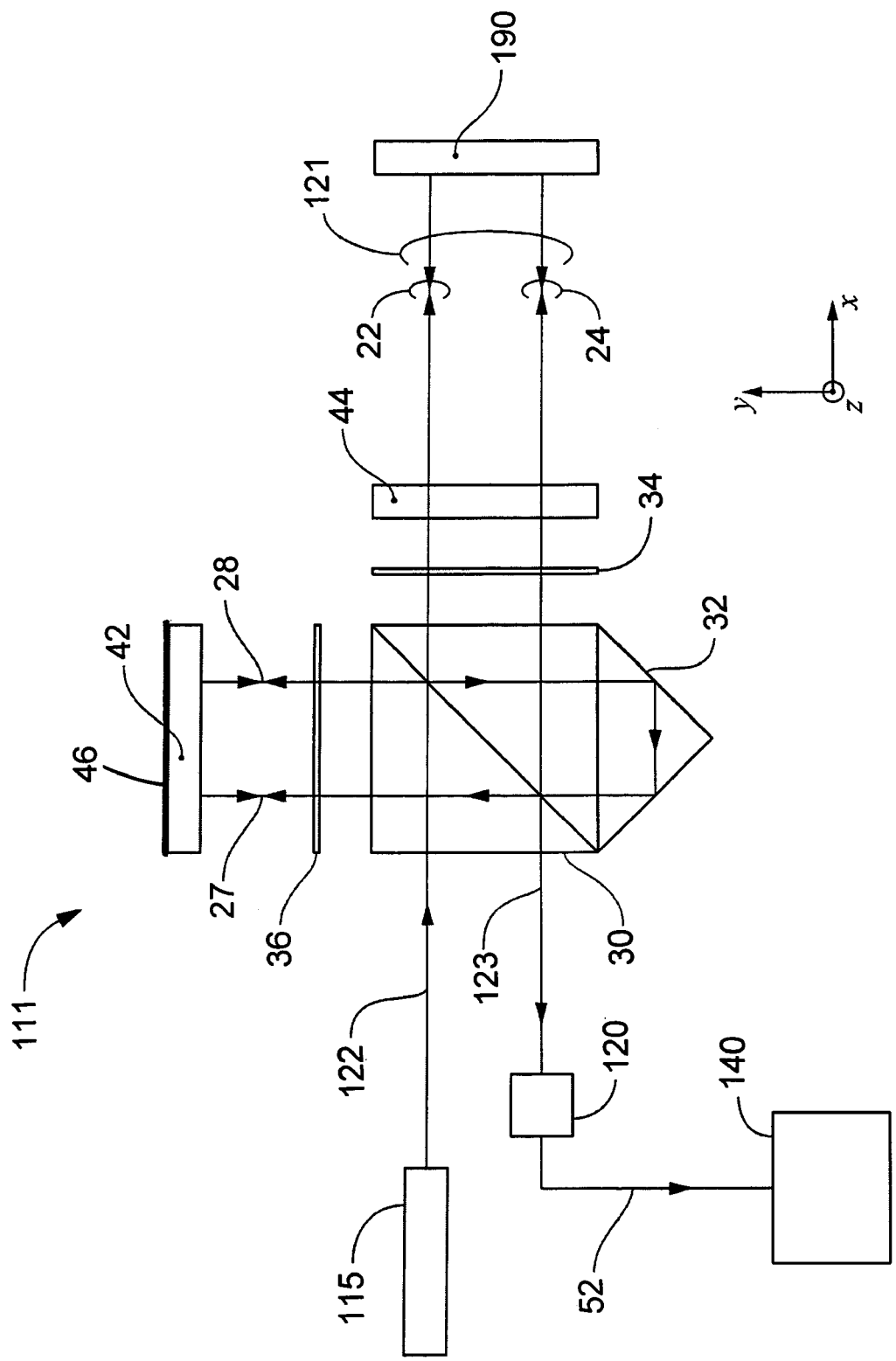
FIG. 2 is a schematic diagram of an embodiment of an interferometry system including a high stability plane mirror interferometer (HSPMI).

In some embodiments, interferometer 110 is a high stability plane mirror interferometer (HSPMI). Referring to FIG. 2, an HSPMI 111 includes a polarization beam-splitter 30, a retroreflector 32, quarter-wave phase retardation plates 34 and 36, backing plate 44 for quarter-wave phase retardation plate 34, and a plane mirror reference object 42 with reflecting surface 46. Input beam 122 is a two-component beam. The two components have different frequencies and are orthogonally plane polarized. The different frequencies can be produced in source 115, for example, by laser Zeeman splitting, by acousto-optical modulation, or internal to the laser using birefringent elements or the like. HSPMI 111 splits input beam 122 into two components. One component, shown as first and second pass measurement beams 22 and 24, reflects from measurement object 190 twice before exiting HSPMI 111. The other component, shown by first and second pass reference beams 28 and 27, reflect from reference mirror 42 twice before exiting HSPMI 111. The exiting beam components overlap and form output beam 123.

An electrical interference signal 52 is generated by the detection of output beam 123 in detector 120. Detector 120 includes a polarizer to mix the reference and measurement beam components of output beam 123 with respect to polarization. Electrical interference signal 52 contains a heterodyne signal having a heterodyne phase Φ.

Figure 3A:
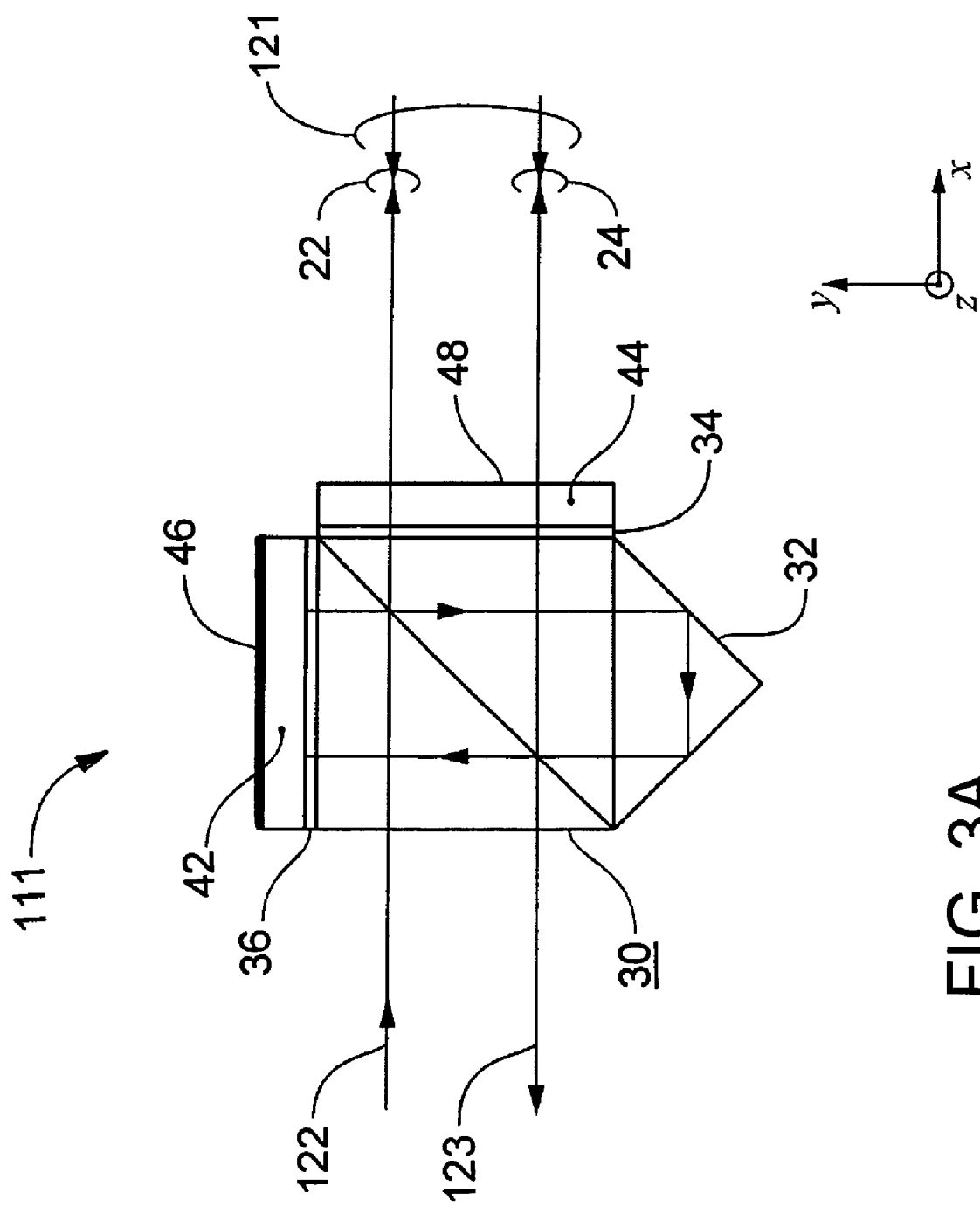
FIG. 3a is a schematic diagram of the HSPMI shown in FIG. 2 where the HSPMI is configured as a compound structure.
Figure 3B:
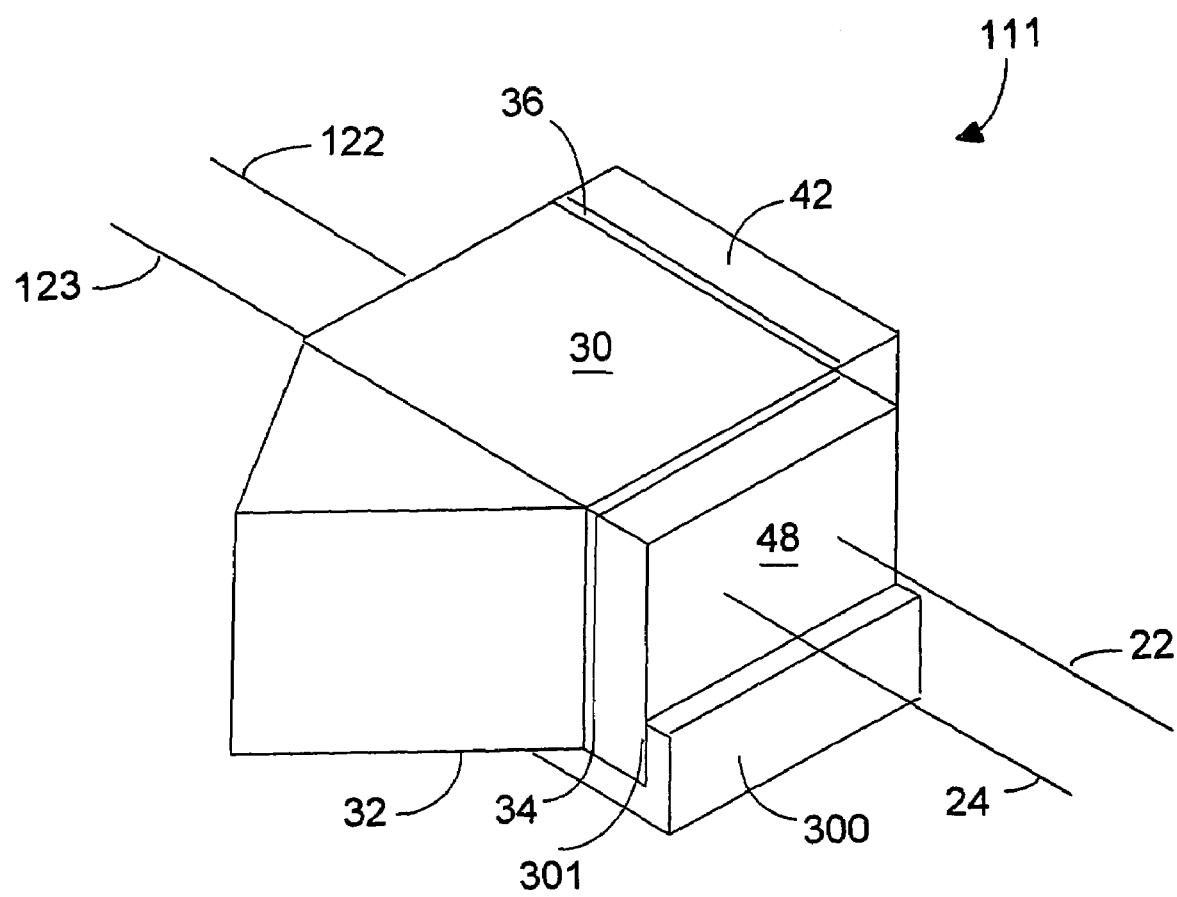
FIG. 3b is a perspective view of the HSPMI shown in FIG. 3a secured to a mechanical fixture.

In general, there is a preferred location (hereinafter referred to as a mounting location) associated with an interferometer such that when the interferometer is mounted using the mounting location to a support structure, such as a frame of a lithography tool, the physical distance between the interferometer and the measurement object does not change with thermal expansion in the interferometer. In embodiments where variations of the optical path length in the measurement beam in the components of the interferometer due to thermal expansion and/or thermal changes in refractive indices are matched by variations in the optical path length of the reference beam, the phase Φ will be insensitive to the thermal expansion. Consider, for example, interferometer 111 constructed as a monolithic structure such as shown in FIG. 3a and 3b. For the case when the optical paths for the reference and measurement beams are matched with respect to thermal properties in the components of interferometer 111 (i.e., within polarization beam-splitter 30, quarter-wave plates 36 and 34, respectively, retroreflector 32, mirror 42 and backing plate 44), and the bonding of the respective components in interferometer 111 is made by optical contacting; the preferred mounting location in the x-direction corresponds to surface 48 of backing plate 44, which is the exit surface of measurement beam 121.

Figure 4A:
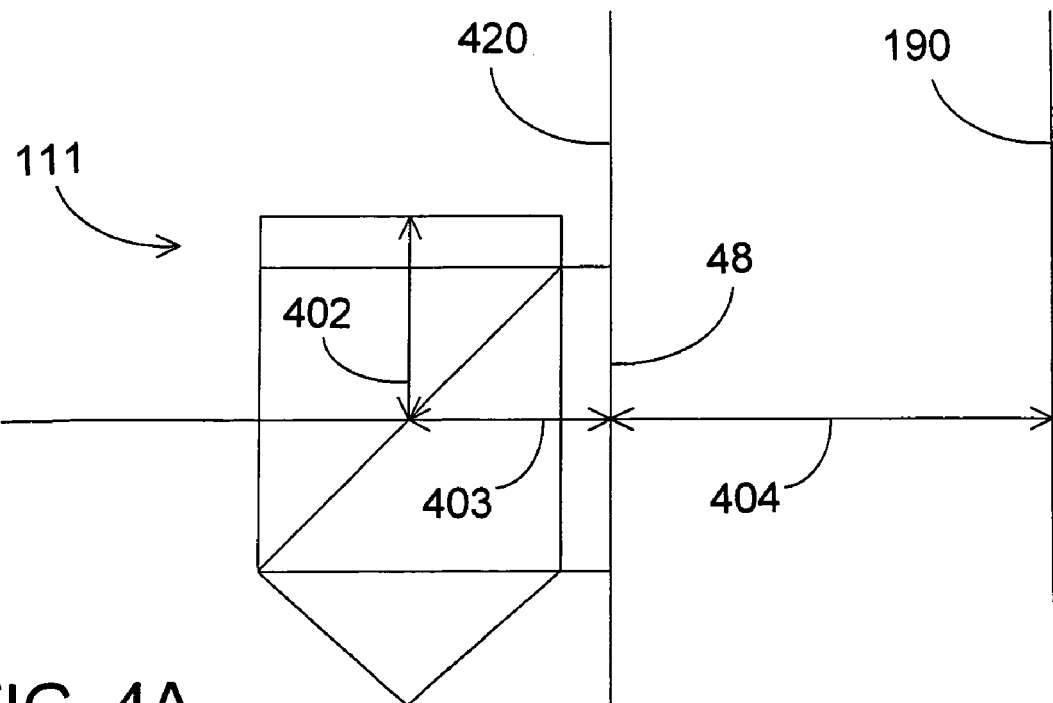
FIGS. 4a and 4b are schematic diagrams showing an HSPMI at different temperatures, respectively, where the exit surface is secured to an object.
Figure 4B:
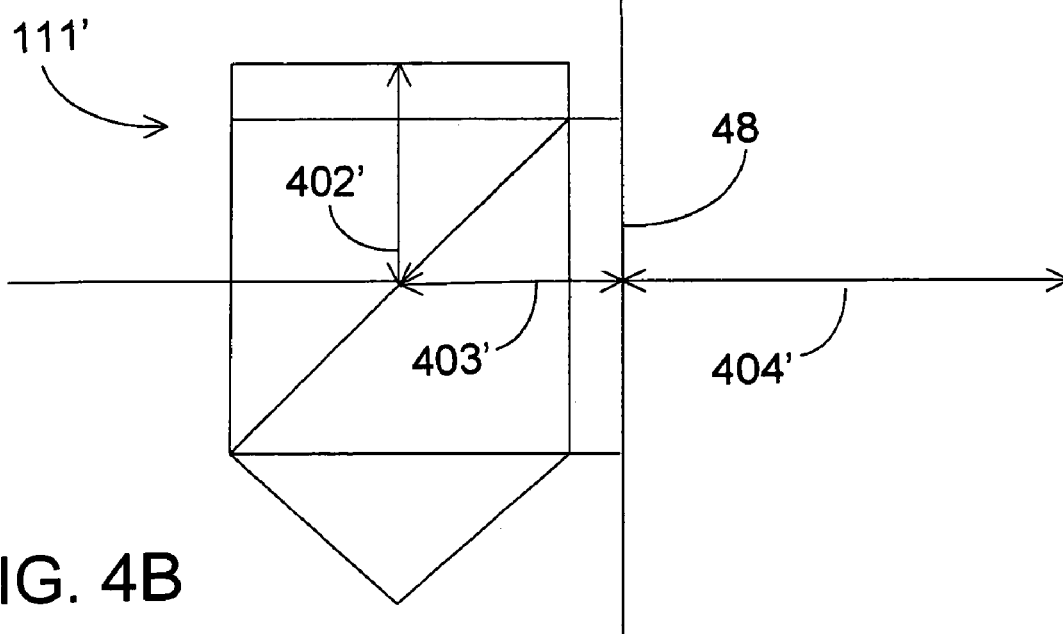

The effect of mounting the reference surface to the support structure is illustrated in FIGS. 4a and 4b. Here, the support structure is depicted by an axis 420, to which exit surface 48 is mechanically secured. FIG. 4a shows interferometer 111 at a first temperature, T, at which exit surface is separated from measurement object 190 by a distance 404, while the measurement beam path within interferometer 111 is related to a distance 403 and the reference beam path within the interferometer is related to distance 402 which is equal to distance 403. Referring to FIG. 4b, at a different temperature, T', interferometer 111 has expanded and is now depicted as interferometer 111'. The measurement beam path within interferometer 111' is related to a distance 403', which is larger than distance 403, and the reference beam path within the interferometer is related to distance 402'. Distance 402' is the equal to distance 403'. Hence the change in distance 402 offsets any changes of the optical path length difference between the measurement and reference beams due to the increase of distance 403 to 403' and any changes in optical path length due to changes in refractive indices along paths corresponding to 402 and 403. Furthermore, because surface 48 remains secured to axis 420, distance 404 is insensitive to the expansion. Accordingly, the phase measured using interferometer 111 in this configuration is insensitive to the thermal expansion.

Figure 4C:
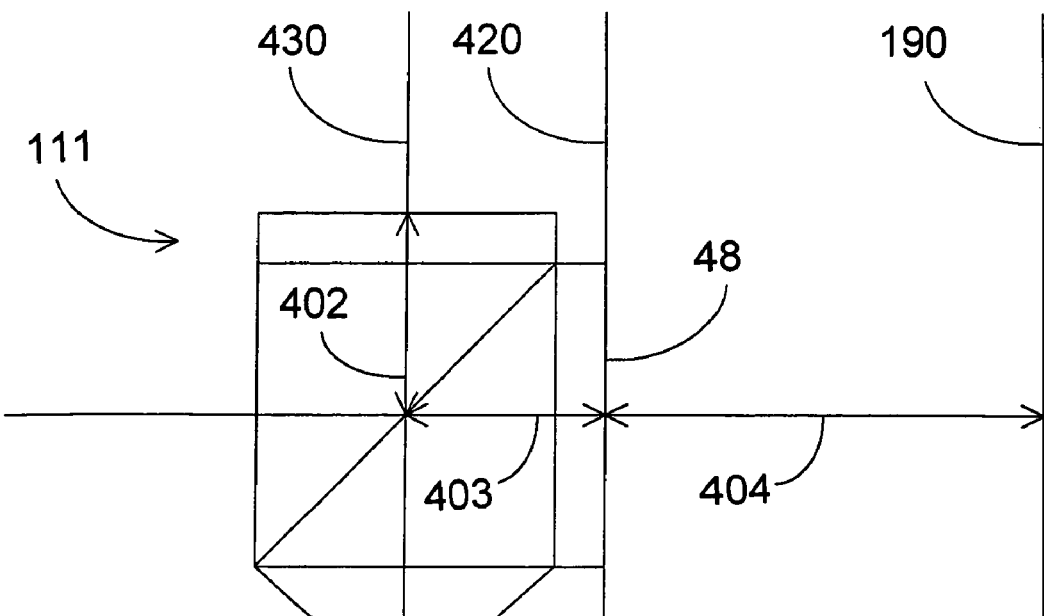
FIGS. 4c and 4d are schematic diagrams showing an HSPMI at different temperatures, respectively, where a location displaced from the exit surface is secured to an object.
Figure 4D:
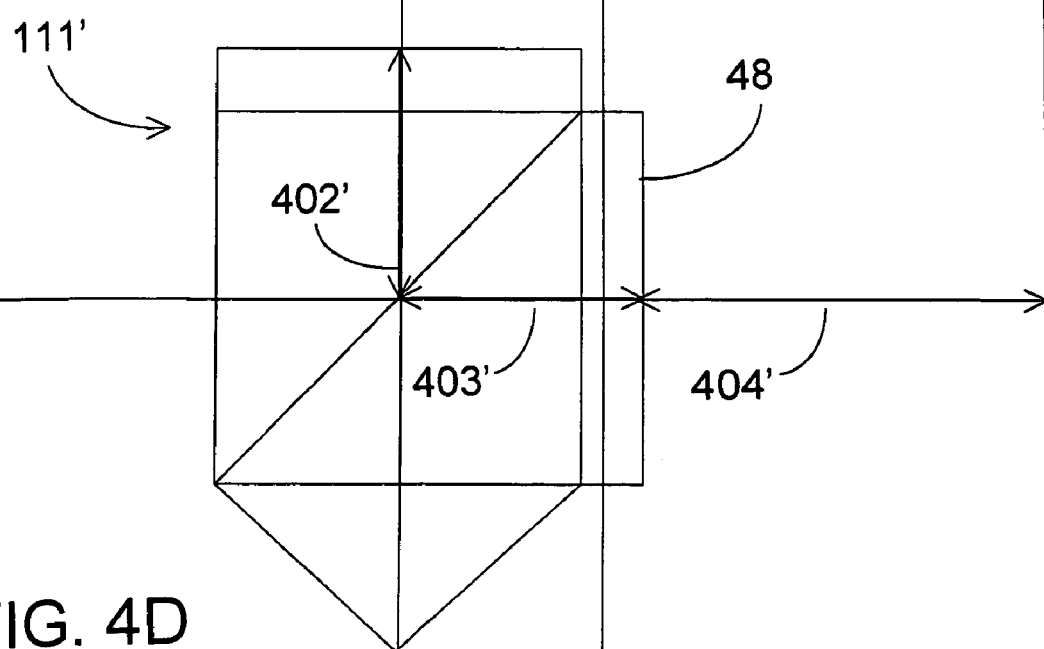

In contrast, referring to FIGS. 4c and 4d, in configurations exit surface 48 is not secured to axis 420 within the reference system, thermal expansion due to a temperature change from T to T' can result in a change in the optical path difference between the measurement and reference beams and measurements made using interferometer 111 can be sensitive to thermal expansion. In particular, FIG. 4c shows interferometer 111 at temperature T with exit surface 48 positioned at axis 420, but mechanically secured at axis 430. Referring to FIG. 4b, at temperature T', interferometer 111' has the same dimensions as before (see FIG. 4b), however surface 48 shifts with respect to axis 420, resulting in a change in the distance between the interferometer and measurement object 190 from 404 to 404'. Thus, the optical path length difference between the measurement and reference beams changes in response to thermal expansion of the interferometer, and measurements made using the interferometer can be sensitive to thermal changes.

Interferometers can be secured to the reference frame using a variety of mounting techniques. For example, interferometers can be bonded to the support structure using an adhesive on the interferometer's reference surface. In some embodiments, an interferometer can be mounting using a mechanical fixture that secures the interferometer to the support structure. As an example, referring again to FIG. 3b, interferometer 111 can be mounted to a support structure using a mechanical fixture 300, which includes a portion that abuts exit surface 48, substantially preventing shifting of surface 48 due to thermal expansion of interferometer 111. Surface 48 can be secured to mechanical fixture 300 by bonding the interferometer to the structure at interface 301.

Mechanical fixture 300 can be supplied with interferometer 111 and can be mechanically secured to the support structure using a bonding adhesive or a mechanical fastener, such as one or more bolts, for example.

Mechanical fixture 300 should be formed from materials that have a coefficient of thermal expansion that matches the thermal expansion coefficient of the support structure so that positional changes of exit surface 48 relative to the support structure due to thermal expansion of the mechanical fixture are minimized.

In some embodiments, mechanical fixture 300 can include kinematic adjustments for aligning interferometer 111 within the support structure.

While the foregoing examples consider interferometers where the optical paths for the reference and measurement beams are matched with respect to thermal properties within the interferometer, in general, the optical paths within the interferometer may not be matched. In embodiments where the measurement and reference beam paths are not matched within the interferometer, the corresponding preferred mounting location is displaced from exit surface 48 by a distance $\Delta X$ such that $$\Delta X = \frac{1}{4\alpha k} \frac{d\Phi}{dT} \quad (1)$$

where k is the wavenumber of input beam 122, T is temperature, and $\alpha$ is the thermal expansion coefficient for the medium between surface 48 and the corresponding preferred mounting reference surface. Where the mounting location is displaced from the exit surface interior to the interferometer, the mounting surface defining the mounting location may be secured to the interferometer including a material that has the same coefficient for expansion as that of the beam-splitter using an adhesive applied between the beam splitter and the material (e.g., at the bottom surface of the beam-splitter with the mounting surface located a distance $\Delta X$ from the exit surface).

In certain embodiments, bonding between components of interferometer 111 may be achieved by the use of an adhesive, such as epoxy, for example. The use of an adhesive may reduce the assembly cost of an interferometer, however, adhesives may have higher thermal optical path effects (e.g., larger dependence of refractive index and/or physical dimension on temperature) than inorganic media such as BK7 and fused silica, for example (e.g., by one to two orders of magnitude). As a consequence, tighter tolerances may be necessary (e.g., by one to two orders of magnitude) on the reference beam path length in the adhesive relative to the measurement beam path length in adhesive.

Figure 5:
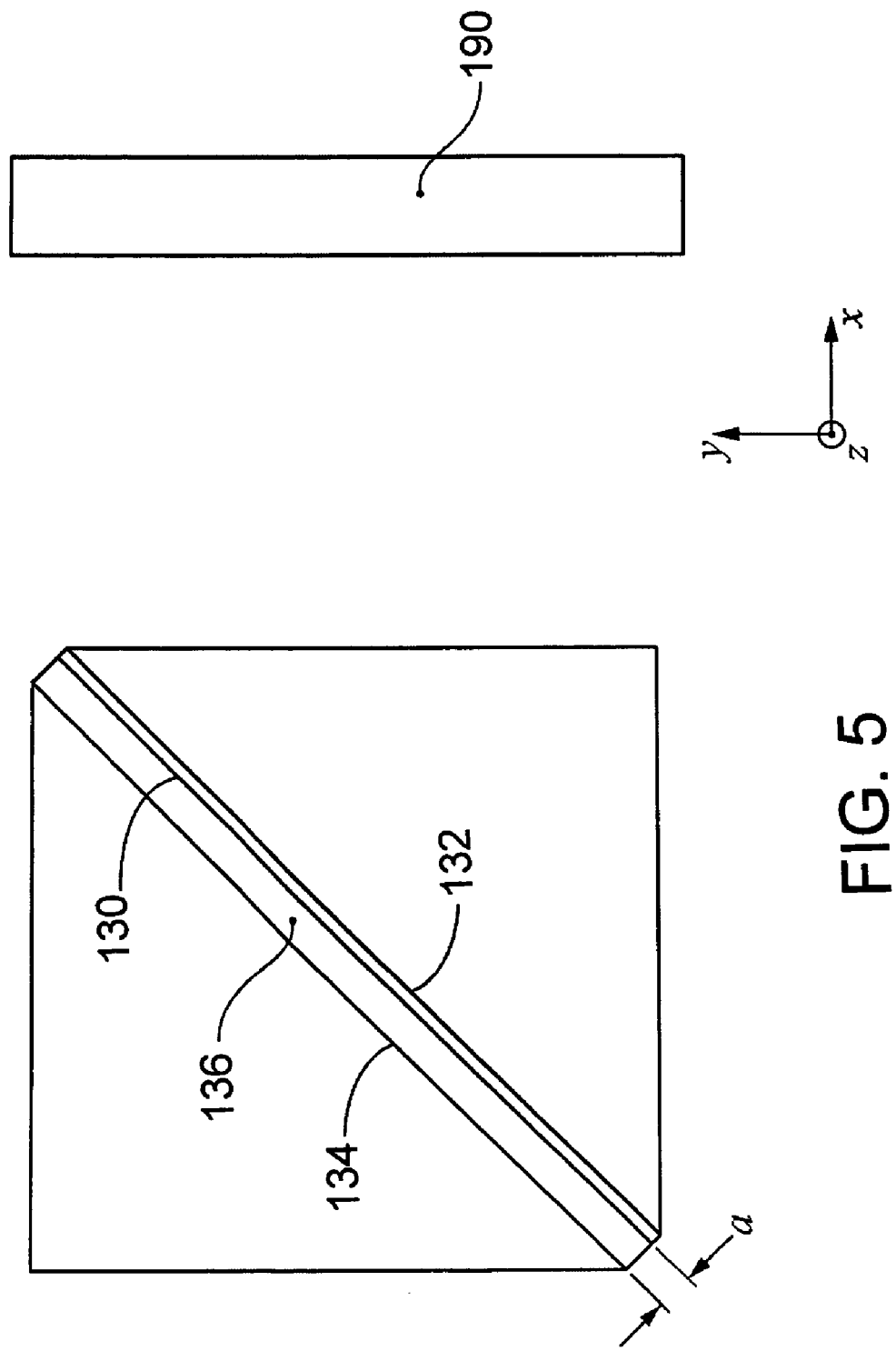
FIG. 5 is a schematic diagram of an embodiment of a beam-splitter.

The thermal effects of adhesive bonds can be further exacerbated by asymmetry that may be present in an interferometer such as 111 with respect to reference and measurement beam paths. For example, the asymmetry arises at the polarization interface of polarization beam-splitter 30. With reference to FIG. 5, consider the case where the polarization coating 130 of the polarization beam-splitter 30 is on a surface 132 and the bond glue 136 of thickness a is in between surface 132 and polarization coating 130. The reference beam experiences an additional path length $\Delta L$ in the glue relative to the measurement beam wherein $$\Delta L = (4\sqrt{2})a. \quad (2)$$

In certain embodiments, the effect of the asymmetry represented by $\Delta L$ is compensated by making the thickness of the glue bond between backing plate 44 and quarter-wave retardation plate 34 thicker than the corresponding glue bond between mirror 42 and quarter-wave retardation plate 36 by the amount $\Delta l$ where $$\Delta l = \sqrt{2}a. \quad (3)$$

Figure 6:
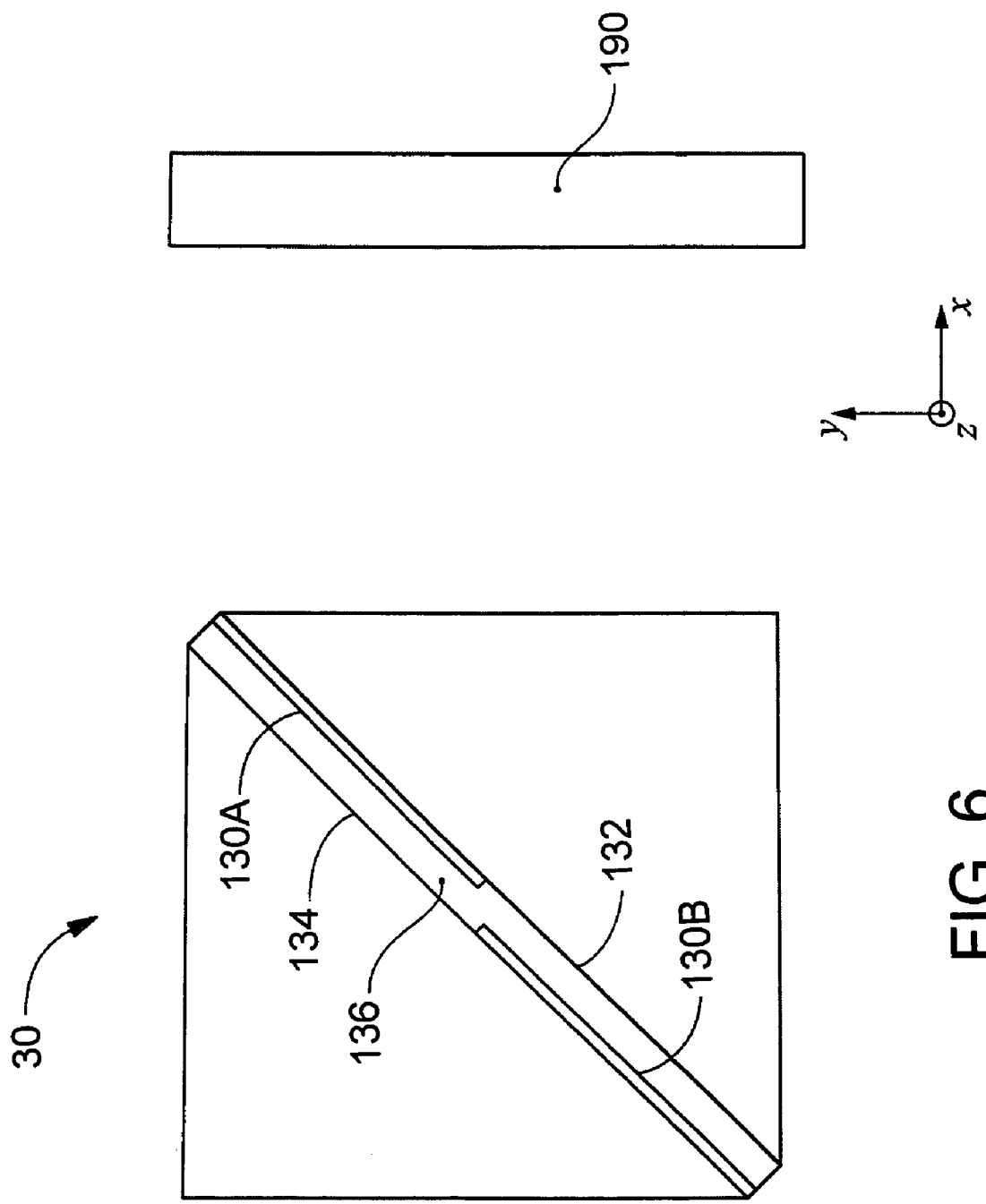
FIG. 6 is a schematic diagram of another embodiment of a beam-splitter.

In some embodiments, the effect of the asymmetry represented by $\Delta L$ as described above is compensated by constructing the polarization interface of two different sections 130A and 130B such as shown in FIG. 6. Polarization interface 130A is attached to surface 132 and polarization interface 130B is attached to surface 134. As a consequence, the reference and measurement beam paths are symmetrized and the thermal non-cyclic error effects can be reduced (e.g., eliminated).

While certain embodiments have been described in which the optical path difference between the measurement and reference beams is directly related to the displacement of the measurement object relative to the interferometer, in some embodiments the error correction techniques described herein can be applied to interferometers in which the optical path difference is directly related to other degrees of freedom of the interferometry system. For example, in some embodiments, the optical path difference can be directly related to the angular orientation of the measurement object. Such embodiments include interferometers where instead of only the measurement beam (not the reference beam) contacting the measurement object, both beams are directed to contact the measurement object but at difference locations. In such a configuration, the phase is directly related to an angular orientation of the measurement object in the plane defined by the two beam paths. Examples of such interferometers are described aforementioned U.S. patent application Ser. No. 10/351,708, entitled "MULTI-AXIS INTERFEROMETER," filed Jan. 27, 2003, by Henry A. Hill.

More generally, examples of other forms of interferometers that may utilize the error correction techniques disclosed herein include both single and multiple pass interferometers (the HSPMI is a double pass interferometer), and include passive interferometers, dynamic interferometers, and dispersion interferometers. Alternatively, or additionally, the error correction techniques can be applied to interferometers that monitor more than one degree of freedom, interferometers that monitor variations in angular orientation of a measurement object, and angular displacement interferometers that measure beam propagation direction. Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93–106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Still other forms of interferometers include those described in commonly owned U.S. patent application Ser. No. 10/351,707 filed Jan. 27, 2003 and entitled "MULTIPLE DEGREE OF FREEDOM INTERFEROMETER" and U.S. patent application Ser. No. 10/227,166 filed Aug. 23, 2002 and entitled "OPTICAL INTERFEROMETRY" by Henry A. Hill, the contents of said applications being incorporated herein by reference.

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 7:
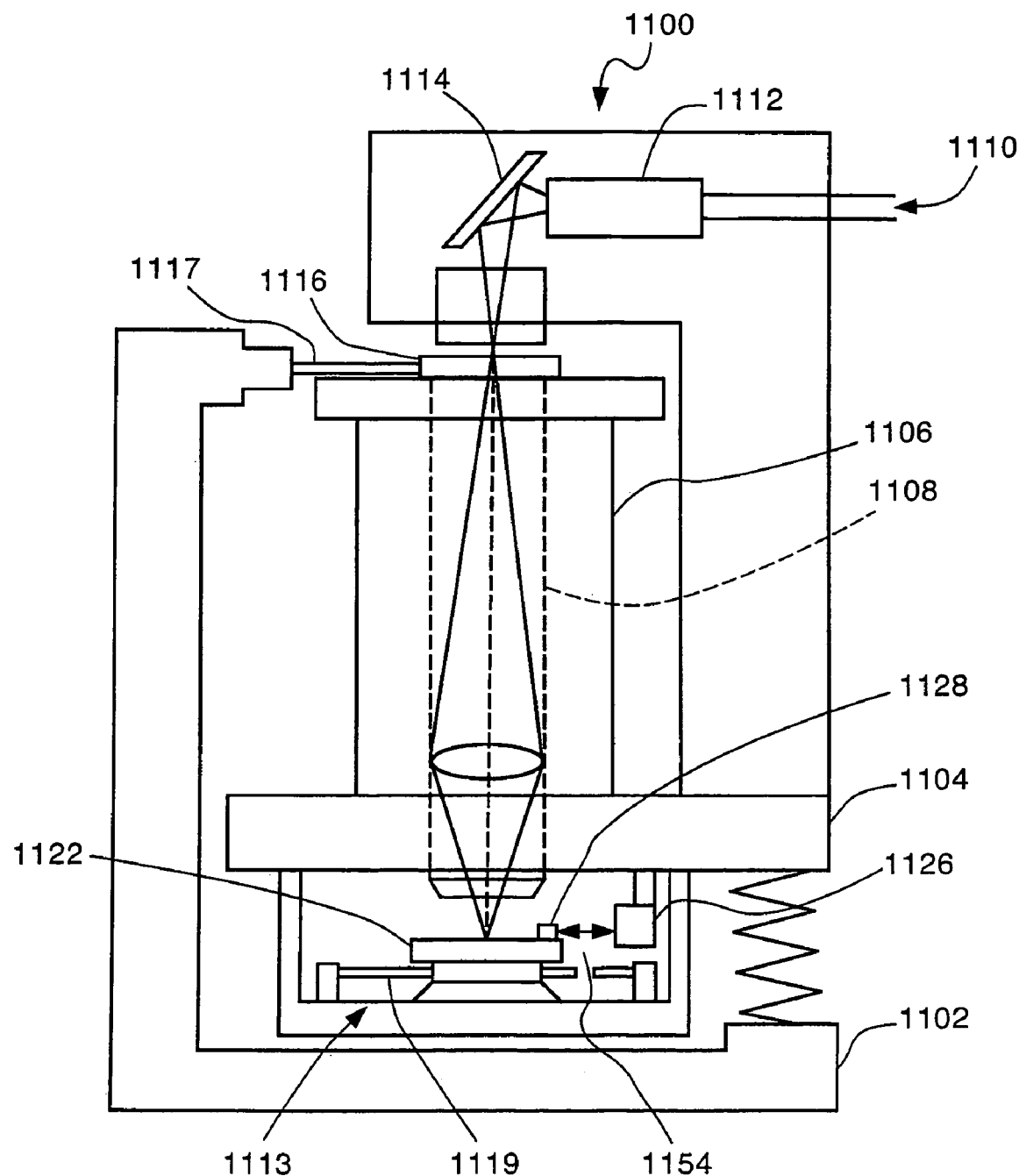
FIG. 7 is a schematic diagram of an embodiment of a lithography tool that includes an interferometer.

An example of a lithography scanner 1100 using an interferometry system 1126 is shown in FIG. 7. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown); passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 8A:
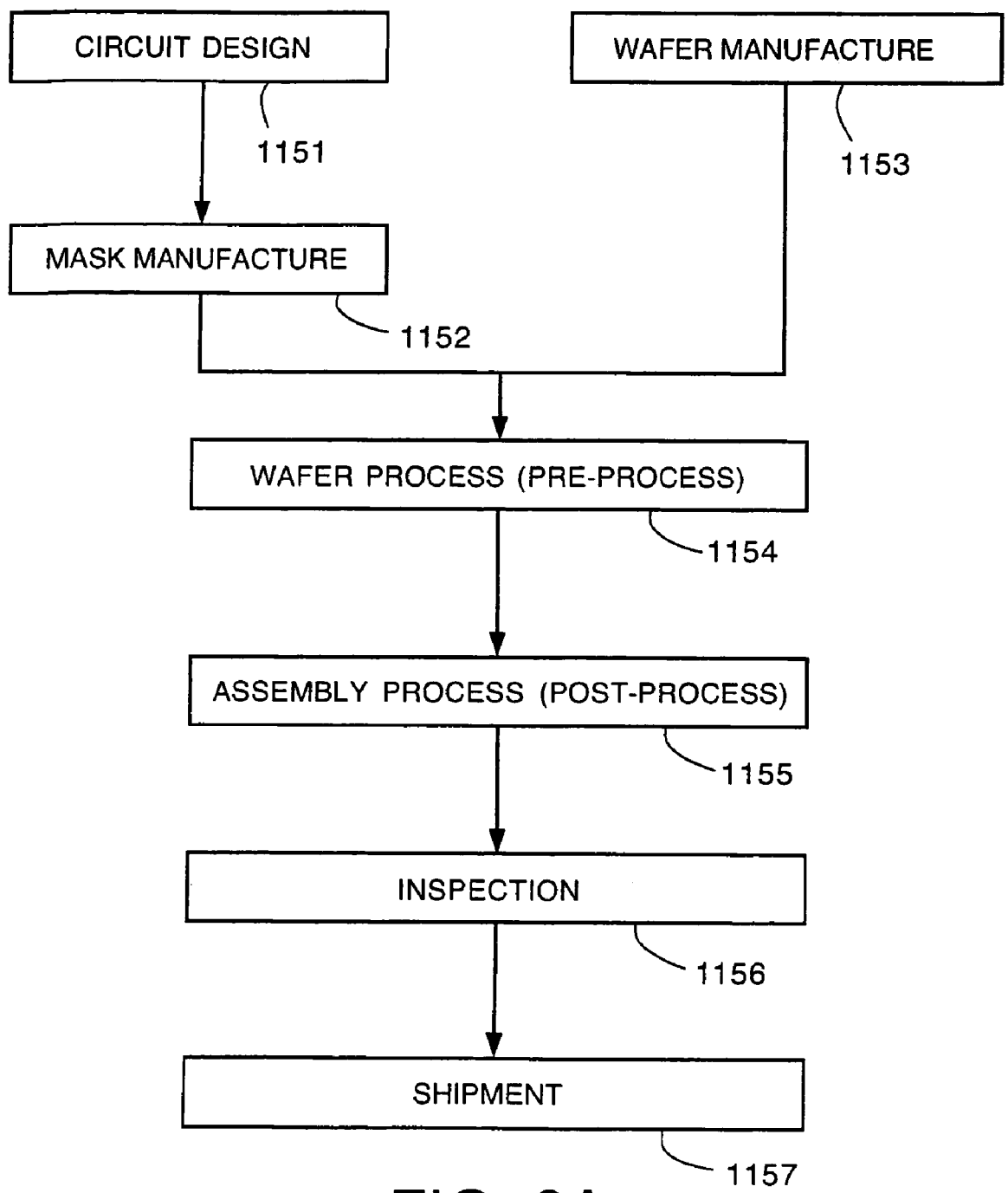
FIG. 8(a) and FIG. 8(b) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 8a and 8b. FIG. 8a is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 8B:
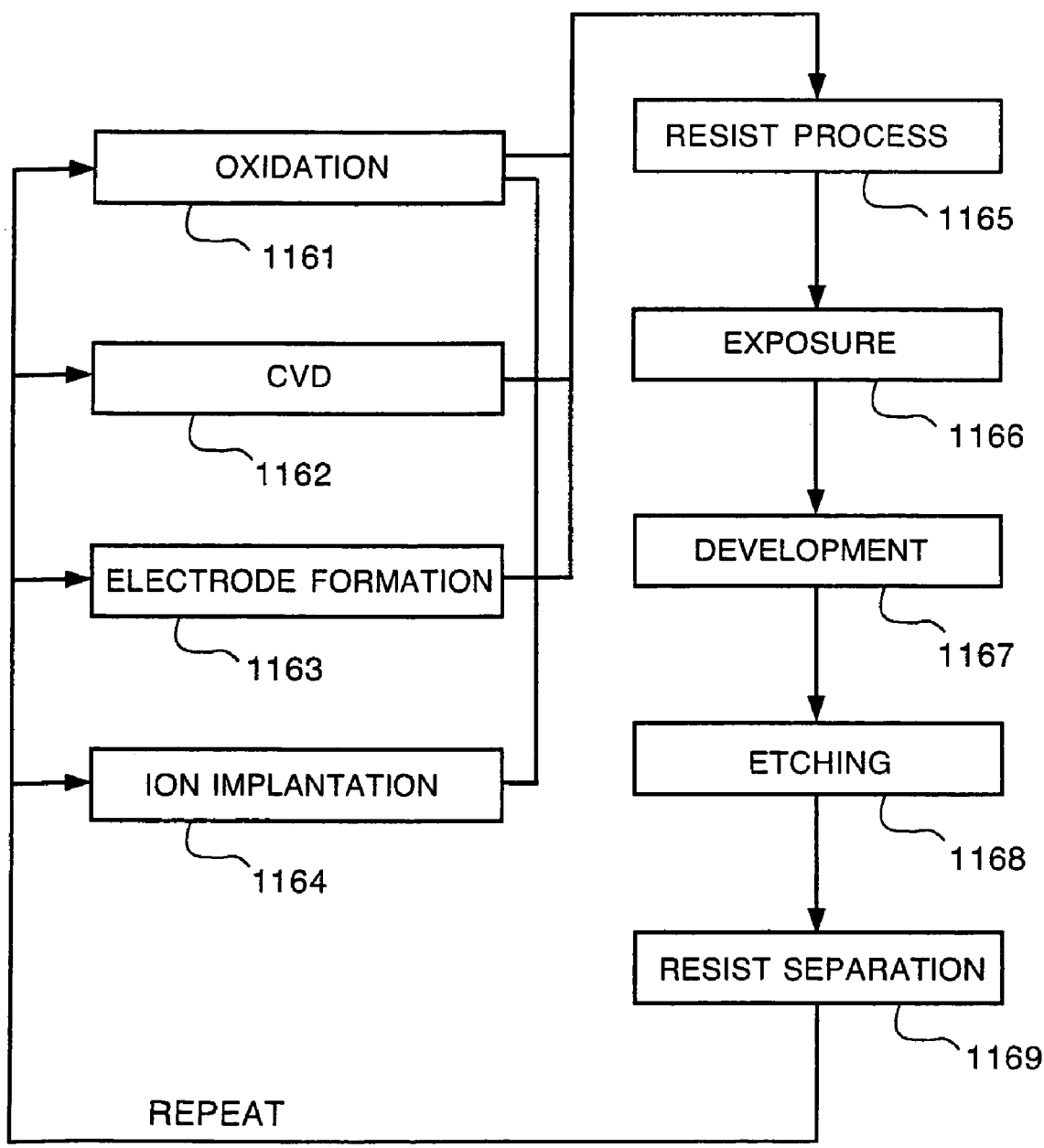

FIG. 8b is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 9:
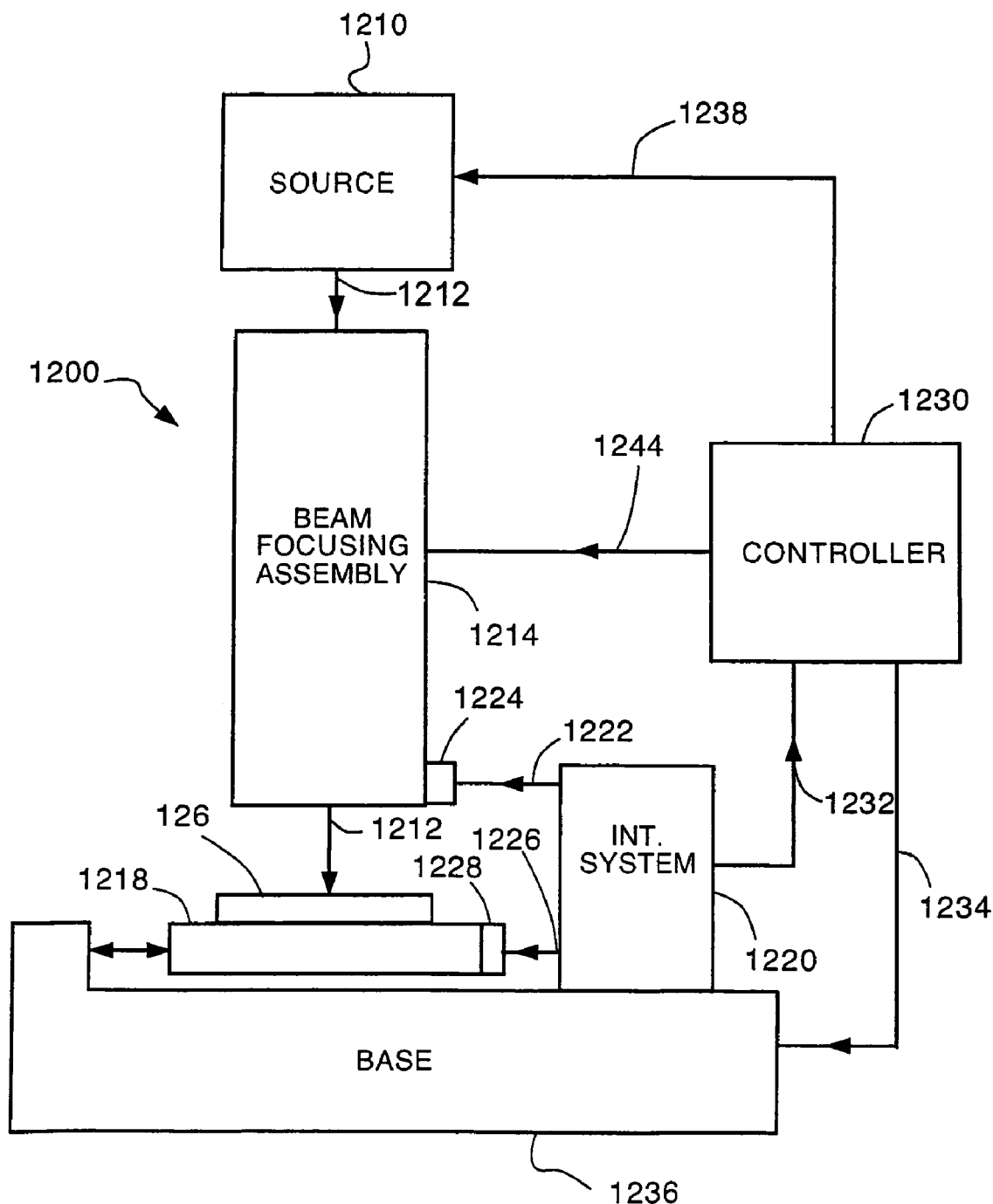
FIG. 9 is a schematic of a beam writing system that includes an interferometry system.

As an example, a schematic of a beam writing system 1200 is shown in FIG. 9. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrupole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention.

What is claimed is:

1. An interferometer assembly for use in a lithography tool used for fabricating integrated circuits on a wafer, wherein the lithography tool includes a support structure and a stage for positioning the wafer relative to the support structure, the interferometer assembly comprising:

an interferometer configured to direct a measurement beam between the stage and the support structure and combine the measurement beam with another beam to form an output beam which comprises a phase related to a position of the stage relative to the support structure, wherein the interferometer is mechanically secured to the lithography tool through an interferometer surface selected to cause a distance between the stage and the support structure along the measurement beam path to be insensitive to thermal expansion of the interferometer over a range of temperatures so that the phase of the output beam is insensitive to thermal changes of the interferometer over the range of temperatures.

2. The interferometry assembly of claim 1, wherein the thermal changes comprise thermal expansion of the interferometer.

3. The interferometry assembly of claim 1, wherein the thermal changes comprise thermally induced changes in a refractive index of the interferometer.

4. The interferometry assembly of claim 1, wherein the interferometer surface mechanically secured to the lithography tool is an exit surface of the measurement beam.

5. The interferometry assembly of claim 1, wherein the interferometer is mechanically secured to the support structure.

6. The interferometry assembly of claim 1, wherein the interferometer is mechanically secured to the stage.

7. The interferometry assembly of claim 1, wherein the measurement beam contacts a measurement object.

8. The interferometry assembly of claim 7, wherein the measurement beam contacts the measurement object more than once.

9. The interferometry assembly of claim 7, wherein the other beam contacts the measurement object.

10. The interferometry assembly of claim 7, wherein the measurement object is a plane mirror.

11. The interferometry assembly of claim 1, wherein the interferometer is a high-stability plane mirror interferometer.

12. The interferometer assembly of claim 1, wherein the interferometer comprises beam splitter including two glass portions that are bonded together by a cement such that an optical path length of the measurement beam through the cement is substantially the same as an optical path length of the other beam through the cement.

13. An apparatus, comprising:
an interferometer, which during operation produces an output beam comprising a phase related to an optical path difference between a path of a first beam, which exits the interferometer at an exit surface and contacts a measurement object, and a path of a second beam; and
a mechanical fixture for mechanically securing the interferometer to an object,
wherein the interferometer is secured to the mechanical fixture at a location of the interferometer that causes a path length between the exit surface and the measurement object to be insensitive to thermal expansion of the interferometer over a range of temperatures so that the phase of the output beam is insensitive to thermal changes of the interferometer over the range of temperatures.

14. The apparatus of claim 13, wherein the thermal changes comprise thermal expansion of the interferometer.

15. The interferometry assembly of claim 13, wherein the thermal changes comprise thermally induced changes in a refractive index of the interferometer.

16. The apparatus of claim 13, wherein the location of the interferometer secured to the mechanical fixture is a portion of an exit surface of the first beam path.

17. The apparatus of claim 13, wherein the location of the interferometer secured to the mechanical fixture corresponds to a portion of the exit surface.

18. The apparatus of claim 13, wherein the interferometer is configured so that a thermal variation an optical path length of the first beam path within the interferometer is substantially equal to a thermal variation of an optical path length of the second beam path within the interferometer.

19. The apparatus of claim 13, wherein the interferometer is configured so that a thermal variation of an optical path length of the first beam path within the interferometer is unequal to a thermal variation of an optical path length of the second beam path within the interferometer.

20. The apparatus of claim 19, wherein the first beam path exits the interferometer at an exit surface and the location of the interferometer secured to the mechanical fixture is displaced from the exit surface by an amount that causes a thermal variation in the optical path difference of the first and second beam paths within the interferometer to be offset by a thermal variation in the optical path length of the first beam path out of the interferometer.

21. The apatus of claim 20, wherein the location of the interferometer secured to the mechanical fixture is displaced by an amount ΔX from the exit surface, where ΔX corresponds to $$\Delta X = \frac{1}{4\alpha k}\frac{d\Phi}{dT},$$

where k is the wavenumber of the first beam, T is the temperature, Φ is the phase, and α is a thermal expansion coefficient of a medium between the exit surface and the location.

22. The apparatus of claim 13, wherein the first beam contacts the measurement object more than once.

23. The apparatus of claim 22, wherein the interferometer is a high-stability plane mirror interferometer.

24. The apparatus of claim 13, wherein the second beam contacts the measurement object.

25. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 13 for monitoring the position of the wafer relative to the imaged radiation.

26. A lithography system for use in fabricating integrated circuits on a wafer, the system comprising:
a stage for supporting the wafer; and
an illumination system including a radiation source, a mask, a positioning system, a lens assembly, and the apparatus of claim 13,
wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

27. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 13 for monitoring the position of the stage relative to the beam directing assembly.

28. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the apparatus of claim 13.

29. A lithography method for use in the fabrication of integrated circuits comprising:
directing input radiation through a mask to produce spatially patterned radiation;
positioning the mask relative to the input radiation;
monitoring the position of the mask relative to the input radiation using the apparatus of claim 13; and
imaging the spatially patterned radiation onto a wafer.

30. A lithography method for fabricating integrated circuits on a wafer comprising:
positioning a first component of a lithography system relative to a second component of a lithography system to expose the wafer to spatially patterned radiation; and monitoring the position of the first component relative to the second component using the apparatus of claim 13.

31. A method for fabricating integrated circuits, the method comprising:

applying a resist to a wafer;

forming a pattern of a mask in the resist by exposing the wafer to radiation using the lithography method of claim 28; and producing an integrated circuit from the wafer.

32. A method for fabricating integrated circuits, the method comprising:

applying a resist to a wafer;

forming a pattern of a mask in the resist by exposing the wafer to radiation using the lithography method of claim 29; and producing an integrated circuit from the wafer.

33. A method for fabricating integrated circuits, the method comprising:

applying a resist to a wafer;

forming a pattern of a mask in the resist by exposing the wafer to radiation using the lithography method of claim 30; and producing an integrated circuit from the wafer.

34. A method for fabricating integrated circuits, the method comprising using the lithography system of claim 25.

35. A method for fabricating integrated circuits, the method comprising using the lithography system of claim 26.

36. A method for fabricating a lithography mask, the method comprising:

directing a write beam to a substrate to pattern the substrate;

positioning the substrate relative to the write beam; and monitoring the position of the substrate relative to the write beam using the apparatus of claim 13.

37. The apparatus of claim 13, wherein the interferometer comprises beam splitter including two glass portions that are bonded together by a cement such that an optical path length of the first beam through the cement is substantially the same as an optical path length of the second beam through the cement.

38. An apparatus, comprising:

an interferometer, which during operation produces an output beam comprising a phase related to an optical path difference between a path of a first beam, which exits the interferometer at an exit surface and contacts a measurement object, and a path of a second beam, the interferometer being configured so that a thermal variation of an optical path length of the first beam path within the interferometer is unequal to a thermal variation of an optical path length of the second beam path within the interferometer; and a mechanical fixture for mechanically securing the interferometer to an object, wherein the interferometer is secured to the mechanical fixture at a location of the interferometer displaced from the exit surface by an amount that causes a thermal variation in the optical path difference of the first and second beam paths within the interferometer to be offset by a thermal variation in the optical path length of the first beam path out of the interferometer so that the phase of the output beam is insensitive to thermal changes of the interferometer over a range of temperatures.

* * * * *